United States Patent [19]
Cheng et al.

[11] Patent Number: 5,357,521
[45] Date of Patent: Oct. 18, 1994

[54] ADDRESS SENSITIVE MEMORY TESTING

[75] Inventors: Chingshun Cheng, Austin; Paul J. Roy, Round Rock, both of Tex.

[73] Assignee: International Business Machines Corporation, Armonk, N.Y.

[21] Appl. No.: 33,066

[22] Filed: Mar. 10, 1993

Related U.S. Application Data

[63] Continuation of Ser. No. 869,088, Apr. 19, 1992, which is a continuation of Ser. No. 479,776, Feb. 14, 1990, abandoned.

[51] Int. Cl.⁵ .............................................. G11C 29/00
[52] U.S. Cl. .................................. 371/21.3; 371/40.1; 371/49.1
[58] Field of Search .................. 371/21.3, 21.2, 21.1, 371/49.3, 49.2, 49.1, 40.1, 51.1, 2.2

[56] References Cited

U.S. PATENT DOCUMENTS

| | | | |
|---|---|---|---|
| 3,231,858 | 1/1966 | Tuomenoksa et al. | 371/51.1 |
| 3,544,777 | 12/1970 | Winkler | 37/21.2 |
| 3,579,199 | 5/1971 | Anderson et al. | 371/21.2 |
| 3,585,378 | 5/1971 | Bouricius et al. | 371/51.1 |
| 3,599,146 | 8/1971 | Weisbecker | 371/51.1 |
| 3,751,649 | 8/1973 | Hart, Jr. | 371/21.1 |
| 3,789,204 | 1/1974 | Barlow | 371/51.1 |
| 4,035,766 | 7/1977 | Barker | 371/51.1 |
| 4,271,521 | 6/1981 | Mahmood | 371/51.1 |
| 4,335,457 | 6/1982 | Early | 371/28 |
| 4,369,511 | 1/1983 | Kimura | 371/21.2 |
| 4,414,665 | 11/1983 | Kimura | 371/21.2 |
| 4,483,003 | 11/1984 | Beal | 371/51.1 |
| 4,559,626 | 12/1985 | Brown | 371/21.2 |
| 4,564,944 | 1/1986 | Arnold et al. | 371/37 |
| 4,692,893 | 9/1987 | Casper | 364/900 |
| 4,692,923 | 9/1987 | Poeppelman | 371/40.4 |
| 4,740,971 | 4/1988 | Tam et al. | 371/21.2 X |
| 4,872,168 | 10/1989 | Aadsen et al. | 371/21.3 |
| 4,958,345 | 9/1990 | Fujisaki | 371/21.3 |
| 4,972,418 | 11/1990 | Chou | 371/21.2 |
| 5,043,943 | 8/1991 | Crisp et al. | 365/189.01 |
| 5,062,109 | 10/1991 | Oshima et al. | 371/21.2 |

FOREIGN PATENT DOCUMENTS

0084460A3  7/1983  European Pat. Off. ..... G06F 11/00

OTHER PUBLICATIONS

Method for Address Fault Detection, IBM Technical Disclosure Bulletin, vol. 32, No. 1, Jun. 1989.

*Primary Examiner*—Hoa T. Nguyen
*Assistant Examiner*—Ly V. Hua
*Attorney, Agent, or Firm*—Andrew J. Dillon; Wayne P. Bailey; Mark E. McBurney

[57] ABSTRACT

A method for testing directly addressable memory in a computer system uses address sensitive test data. When a memory error occurs, or when an initial testing of the memory indicates an error, the affected locations are retested with selected address sensitive memory test patterns. Proper address sensitive pattern selection allows all of the data bits, ECC data bits and address parity bits to be tested.

5 Claims, 3 Drawing Sheets

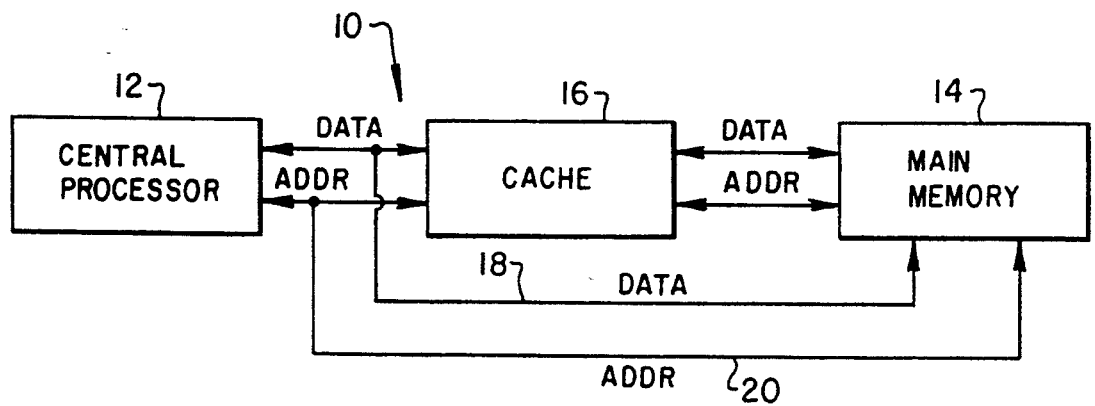
Fig. 1
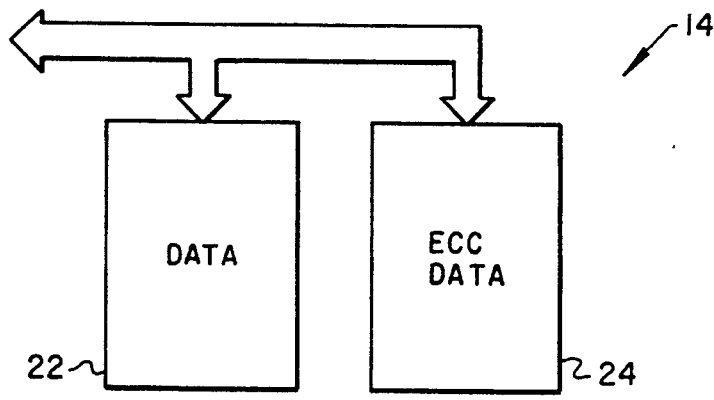
Fig. 2
|  |  | CHECK BYTE | |
|---|---|---|---|
| TEST DATA | | EVEN PARITY | ODD PARITY |
| AAAAAAAA AAAAAAAA AAAAAAAA AAAAAAAA | 36 | 9F | A7 |
| 55555555 55555555 55555555 55555555 | 38 | 3E | 06 |
| FFFFFFFF FFFFFFFF C0C0C0C0 00000000 | 40 | E1 | D9 |
| 00000000 00000000 3F3F3F3F FFFFFFFF | 42 | 40 | 78 |
| 30 | | 32 | 34 |
Fig. 3

| | TEST DATA | ADDRESS | ADDRESS PARITY | CHECK WORD |
|---|---|---|---|---|
| 44 | AAAAAAAA...AAAAAAAA | 014857F0 | 1010 | A79FA79F |
| 46 | AAAAAAAA...AAAAAAAA | 13250350 | 1110 | A7A79F9F |
| 48 | 55555555...55555555 | 014857F0 | 1010 | 063E063E |
| 50 | 55555555...55555555 | 13250350 | 1110 | 06063E3E |
|  |  | 52 | 54 | 56 |

ADDRESS SENSITIVE MEMORY TESTING

This is a continuation of application Ser. No. 07/869,088, filed Apr. 14, 1992, which is a continuation of application Ser. No. 07/479,776, filed Feb. 14, 1990, now abandoned.

BACKGROUND OF THE INVENTION

1. Field of the Invention

The present invention relates generally to digital computer systems, and more specifically to techniques for testing memory locations within such computer systems.

2. Description of the Prior Art

In digital computer systems, testing of memory included in such systems is important. In general, memory testing is performed prior to using the computer system. However, it is possible to test memory while the system is operating, if desired.

Memory testing becomes more important as computer systems grow to include larger memories, since the chances of a memory error increase as the memory size increases. Many recent systems include error correcting code (ECC) instead of the simple parity bits included in older and smaller systems. Use of ECC allows the correction of soft errors during execution of the system, and increased reliability in detecting multi-bit errors.

Reliability of a system can be increased by checking address parity as well as parity of the data. Address parity checking allows detection and isolation of address-related faults.

It would be desirable to provide a method for determining the location of a memory error, and identify whether such an error is data, ECC data, or address related.

SUMMARY OF THE INVENTION

It is therefor an object of the present invention to provide a method for determining whether a memory error is due to an error in the data, the ECC, or the address.

It is a further object of the present invention to provide such a method which is performed with a simple check using a minimal number of steps.

Therefor, according to the present invention, a method for testing a computer system uses address sensitive test data. When a memory error occurs, or when an initial testing of the memory indicates an error, the affected locations are retested with selected address sensitive memory test patterns. Proper address sensitive pattern selection allows all of the data bits, ECC data bits and address parity bits to be tested.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a high level block diagram of a portion of a computer system;

FIG. 2 is a block diagram illustrating the relationship between data and error correcting code data;

FIG. 3 is a table indicating one set of test data according to the present invention;

DESCRIPTION OF THE PREFERRED EMBODIMENT

Figures 4, 6:
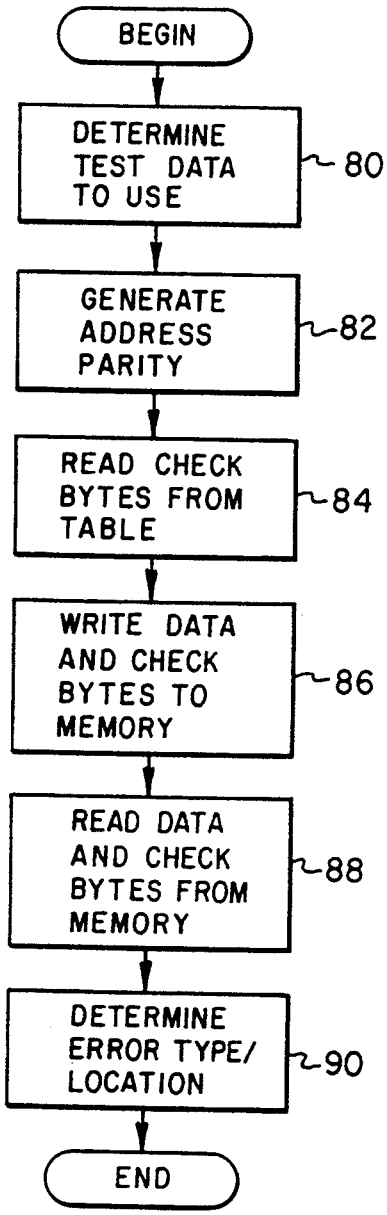
FIG. 4 is a table illustrating examples of the present invention as applied to some of the test data of FIG. 3.
FIG. 6 is a flow chart illustrating testing of selected memory locations to determine the types of errors which have occurred.

Referring to FIG. 1, a computer system is generally designated by the reference number 10. Computer system 10 includes a central processor 12 and main memory 14. A cache subsystem 16 is located between the central processor 12 and the main memory 14. Data and address lines connect the central processor 12 to the cache 16, and connect the cache 16 to the main memory 14. In special circumstances, data lines 18 and address lines 20 can be used to bypass the cache 16 and give the central processor 12 direct access to main memory 14. The remainder of the system 10, including mass storage and input/output devices, is conventional and is not shown in FIG. 1.

FIG. 2 illustrates the high level organization of main memory 14. Main memory 14 includes a data memory portion 22 and an error correcting code (ECC) data portion 24. The contents of the data memory are normally accessible by user applications, while the contents of the ECC data memory 24 are generally only accessible to error checking hardware portions of the system and are not accessible to user applications. In special circumstances, in order to perform testing, direct access can be made to the ECC data memory 24 by an executing application.

As known in the art, the rate of data transfer between the cache 16 and main memory 14 can be greatly increased by using block data transfers to move information between them. The cache memory 16 is typically organized into some number of "lines", with the minimum data transfer size between the main memory 14 and cache 16 being equal to one line. For example, each cache line could have 32, 64, or 128 bytes of data. With a 32 byte cache line, 32 bytes are fetched using a block transfer from the main memory 14 each time a cache miss occurs.

In the preferred embodiment describe herein, data is organized into groupings referred to as "quad-words" as well as into words and bytes. Each word contains four 8-bit bytes, and each quad-word contains four words. The size of each cache line is an integral multiple of the quad-word size. Thus, cache lines can have sizes of, for example, 32 or 64 bytes. Cache lines of these sizes correspond to cache lines having two or four quad-words, respectively.

Since data is always transferred to and from main memory in multiples of quad-words, ECC information can be maintained based on quad-word sized units of information. In a preferred embodiment, one ECC check byte corresponds to four data bytes, so that four check bytes correspond to each quad-word. Each check byte is derived from one byte from each word of the quad-word. Thus, the first check byte provides ECC information for the combination of the first byte from each word of the quad-word. The second check byte is generated using the second byte in each word of the quad-word, and so forth.

As is known in the art, an ECC capable of correcting all 1-bit errors and detecting multi-bit errors can be produced using a 7-bit ECC for 32 bits of information. Thus, each check byte has 1 spare bit, which can be set equal to a data bit value or otherwise used as desired.

FIG. 3 is a table 30 of test data for use according to the present invention. Table 30 shows four quad-words of test data, and corresponding check bytes which can be generated therefrom using even parity (column 32) and odd parity (column 34). The error correction hardware will determine which codes are generated for any given data value. A complete test pattern can be derived, including data and check bytes, for any selected ECC algorithm implemented on a particular system. The bit settings for the check bytes are generated based on the hardware implementation of merging the address bits and data bits.

As described above, each check byte is formed using 1 byte of data from each word in the quad-word. Thus, for example, the even parity check byte E1 is formed from the data bits FFFFC000. Since each word shown in the table 30 has four identical bytes, the same check byte is formed for each of the four positions for which it can be generated.

Table 30 indicates a preferred set of test data for exercising all of the bits of a quad-word memory location and all of the bits of the corresponding four ECC bytes. Each byte in entry 36 contains the hexidecimal value 'AA', while each byte of entry 38 contains the hexidecimal value '55'. Entries 40 and 42 contain the hexidecimal values shown. Writing all four test values to a quad-word location causes each data bit and each ECC bit to be set to a 0 and to a 1 at least once.

According to the present invention, when a memory location has an error, selected test patterns are written to such memory location in order to identify the type of problem which caused the error. Preferably, the four test data patterns 36, 38, 40, 42 shown in table 30 are used, along with corresponding ECC data used as shown in FIG. 4. The test data patterns are written to the memory location which is being tested in the usual way, but the ECC data is modified in an address sensitive manner before it is written to the corresponding ECC data memory 24. Preferably, the quad-word address is used to determine whether each check byte is written using odd or even parity.

FIG. 4 shows four examples illustrating operation of the address sensitive ECC calculation. The four check bytes for a quad-word can be referred to as a check word. FIG. 4 has two examples 44, 46 for the test data entry 36, and two examples 48, 50 for the test data 38. Each test data entry 44–50 is being used to test a particular address which is shown in column 52. Four parity bits corresponding to the address 52 are shown in column 54, and the check word which is generated is shown in column 56.

In the first example, test data value 44 is written to the address '014857F0'. Parity is calculated separately for each byte of the address, resulting in the bit pattern '1010'. This indicates that the first and third bytes of the address each have an odd number of 1's, while the second and fourth bytes each have an even number of 1's. The ECC data to be written into the check word is taken from column 32 or column 34 of the table 30 if the corresponding positional byte of the address has even or odd parity, respectively. Thus, for test data 44 written into address '014857F0', the first and third bytes of the check word 56 are chosen from the odd parity column 34 of table 30, while the second and fourth bytes are chosen from the even parity column 32 of table 30. The resulting check word is therefor 'A79FA79F'.

In the second example the same test data value 46 is written into address location '13250350'. The address parity bit pattern '1100' indicates that the first two bytes of the address have odd parity, while the second 2 have even parity. Therefor, the first two bytes of the check word 56 are selected from the odd parity column 34 of table 30, while the last two are selected from the even parity column 32 of table 30.

In the last two examples of FIG. 4, the test data value 48, 50 is written into the same two addresses used in the previous two examples. The same address parity bit patterns are generated in column 54, and the corresponding check words are shown in column 56.

Figure 5:
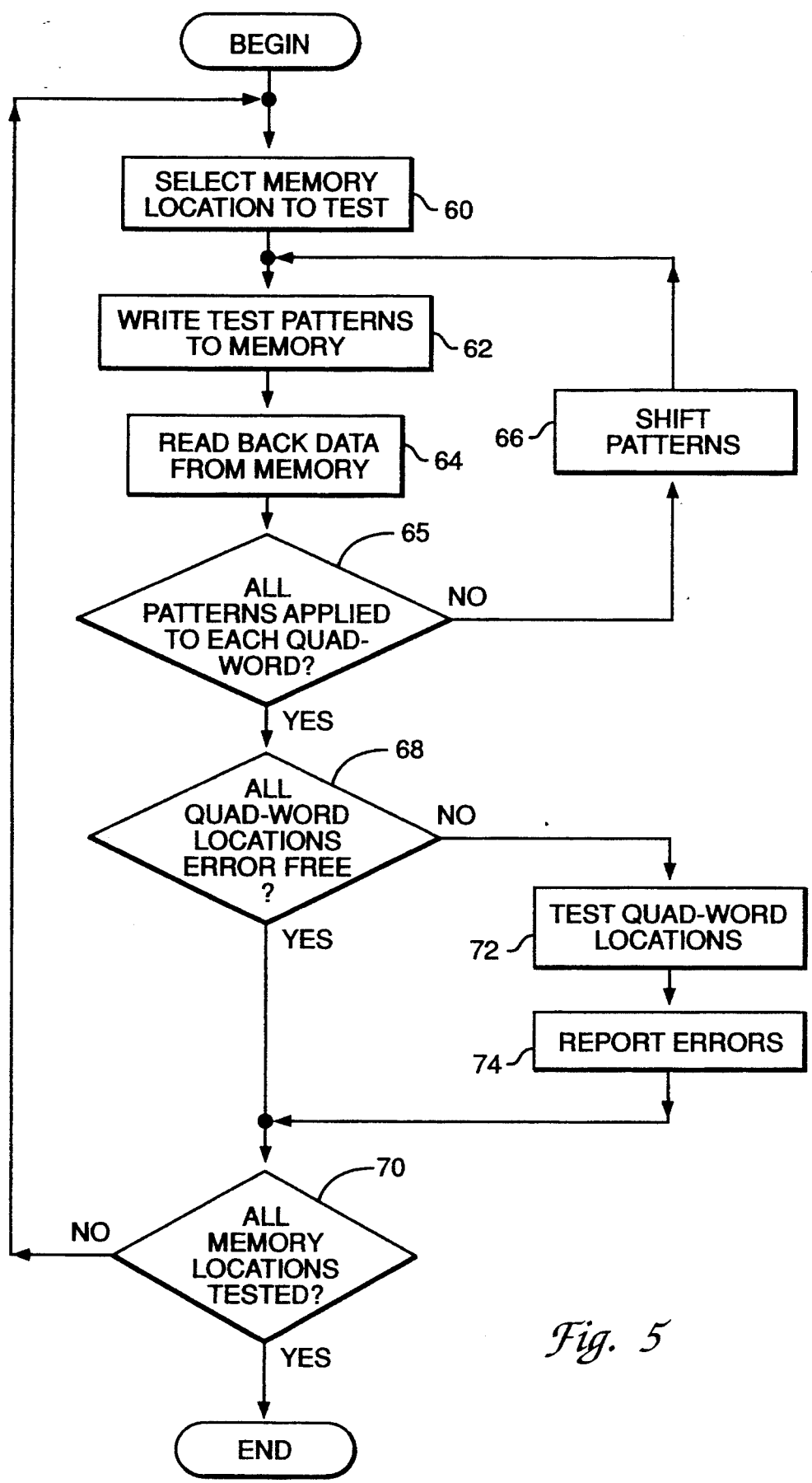
FIG. 5 is a flow chart illustrating testing of system memory according to the present invention.

Use of the test data shown in FIG. 3 and the corresponding address sensitive check words is shown in the flow charts of FIGS. 5 and 6. Referring to FIG. 5, the overall testing process is shown. First, a memory location is selected for testing 60. This location can be a single quad-word, or may preferably be a block of consecutive quad-words. The quad-words corresponding to one or more cache lines make a convenient block of memory for testing. Next, a test pattern is written to the selected memory location 62. A selected test data pattern 36, 38, 40, or 42 is written to each quad-word location to be tested. The data is then read back from each memory location 64. The four test patterns 36, 38, 40 and 42 are each written to each quad-word location within the memory location to be tested. At step 66 the particular pattern to be used with each test is shifted into place to be written to the appropriate location. Thus, the loop consisting of steps 62, 64, and 66 is repeated four times until all quad-words have been tested with each of the four patterns as determined at step 65.

The write and read back of data is performed using the cache memory 16. Data is written to the cache 16, and written through to the main memory 14. The cache 16 is then flushed, so that any attempt to read the just written locations causes a cache miss and a fetch from main memory 14. When the data is read back from main memory 14 into the cache 16, the normal ECC checks are made. Any data errors cause an interrupt to be raised. If all four test patterns are successfully read back from all memory locations, indicating that all of the memory tested in this step is good 68, a check is made 70 to see whether the test procedure is complete. If not, control returns to step 60 to test another block of memory. If so, the testing process ends.

If one or more quad-word memory locations were not read back successfully during step 64, it is necessary to test the faulty quad-word memory locations 72 and report the nature of the errors 74. The testing of step 72 is preferably performed while bypassing the cache 16 and writing directly to, and reading directly from, the main memory 14. This allows the check word to be written using the odd and even check byte selection described in connection with FIG. 4.

Referring to FIG. 6, a preferred method is shown for testing memory locations which indicate an error as a result of the testing of FIG. 5. The first step is to determine which test data to use 80. If only one or two test patterns generated an error for a particular memory location, it is necessary to test that location using only those test patterns. The next step is to generate the address parity 82 as described in connection with FIG. 4, and read the appropriate check bytes from table 30.

The values shown in columns 32 and 34 of table 30 are preferably stored as a table within the application performing the memory testing, and need not be recalculated each time.

The data and check bytes are then written to memory 86. The data and check bytes are written directly to main memory 14, bypassing the cache 16, in order to allow the check word to be written using the address sensitive parity scheme described in connection with FIG. 4. This bypasses the normal ECC generation function of the cache 16. The data and check bytes are then read back from memory 88, and compared to the just written values. The error type and location can be determined 90 from the values read back.

If the check bytes read back differ from those just written, it is known that some type of addressing error has occurred. If the data is read back incorrectly, it is known that an error has occurred in the data portion of the memory. If both the data and check bytes are read correctly in step 88, it is known that an error has occurred somewhere in the cache 16, probably in the hardware for generating and detecting the ECC information.

A simple technique has been described herein which can be used to determined the location and types of memory errors occurring in certain types of computer system memories. If an error is indicated in a certain memory location, the location can be retested and the cause of the error identified. A simple software routine performs the testing and identifies the cause of the error using load and store commands which bypass the cache 16. This pattern testing can be achieved through table look up of the appropriate ECC information, or by computing such information each time the testing is done. The use of address parity to change the information placed into the check word allows addressing errors to be identified.

The test data shown in table 30 is not unique, and any data set which tests all of the bits in the data and in the corresponding ECC data can be used. The precise steps used to test memory locations can be varied to suit the requirements of a particular design.

While the invention has been particularly shown and described with reference to a preferred embodiment, various changes in form and detail may be made therein without departing from the spirit and scope of the invention.

What is claimed is:

1. A method of diagnosing a memory location in a computer memory comprising the steps of:
   segregating an address for the memory location into a plurality of portions;
   writing a test data pattern to the memory location;
   determining, based on an error in said memory location, an address sensitive check word corresponding to the test data pattern by:
      determining parity for each of the plurality of portions;
      selecting particular error correction code check bytes, for each of the plurality of portions based upon said parity; and
      combining the particular error correction code check bytes to create the address sensitive check word;
   writing the address sensitive check word to an error correction location associated with the memory location;
   reading a first value from the memory location and a second value from the error correction location;
   comparing the test data pattern to the first value, and comparing the address sensitive check word to the second value, to identify a type of error for said memory location.

2. The method of claim 1, wherein said step of selecting particular error correction code check bytes comprises the step of reading each particular one of the error correction code check bytes from a look up table.

3. In a data processing system having a central processor, a memory including a data memory portion and an error correcting code storage portion, a cache memory responsive to data written to the data memory portion for generating error correcting code for the data and writing the error correcting code to the error correcting code storage portion, a first data path for storage and retrieval of data from the memory through the cache and a second data path bypassing the cache for storage and retrieval of data from memory, a method of testing the memory comprising the steps of:
   providing a sequence of data test patterns for exercising a memory location and a sequence of error check patterns;
   selecting a location in the data memory portion for testing;
   writing a data test pattern from the sequence to the location on the first data path;
   flushing each data test pattern from the cache as written;
   utilizing an address for the location for retrieving read back data and error correcting code after each data test pattern is written;
   processing the read back data and the error correcting code to determine occurrence of error;
   responsive to no occurrence of error, determining if the sequence of data test patterns has been completed for the location;
   responsive to the sequence of data test patterns having been completed, ending testing of the location;
   responsive to the sequence of data test patterns not being completed, returning to the step of writing a data test pattern from the sequence of data test patterns to the location;
   responsive to occurrence of error for the location, writing a data test pattern from the sequence of data test patterns to the location via the second data path;
   generating a check word from an error check pattern from the sequence of error check patterns and from an address for the location and writing the check word to a location in the error correcting code storage portion;
   utilizing the address for the location for retrieving read back test data and read back check data; and
   comparing the read back test data to the test data pattern and the read back check data to the check word to determine an error type.

4. A method as set forth in claim 3, wherein the step of providing a sequence of error check patterns further includes:
   providing a subsequence of error check patterns for use with location address segments for which have odd parity; and
   providing a subsequence of error check patterns for use with location address segments for which have even parity.

5. A method as set forth in claim 4, wherein the comparing step includes:
  responsive to the read back check word differing from the check word, indicating that an addressing error has occurred;
  responsive to the read back test data differing from the data test pattern, indicating that an error has occurred in the data storage portion of the memory;
  responsive to no difference occurring between the read back test data and the test data pattern and between the read back check data and the check word, indicating that error has occurred in the cache.

* * * * *